(12) United States Patent
Pillay et al.

(10) Patent No.: US 11,036,604 B2
(45) Date of Patent: Jun. 15, 2021

(54) PARALLEL FAULT SIMULATOR WITH BACK PROPAGATION ENHANCEMENT

(71) Applicant: Mentor Graphics Corporation, Wilsonville, OR (US)

(72) Inventors: Sanjay Pillay, Aust, TX (US); Arun Kumar Gogineni, Cedar Park, TX (US); Srikanth Rengarajan, Austin, TX (US)

(73) Assignee: Siemens Industry Software Inc., Plano, TX (US)

( * ) Notice: Subject to any disclaimer, the term of this patent is extended or adjusted under 35 U.S.C. 154(b) by 113 days.

(21) Appl. No.: 16/208,272

(22) Filed: Dec. 3, 2018

(65) Prior Publication Data

US 2019/0171539 A1 Jun. 6, 2019

Related U.S. Application Data

(60) Provisional application No. 62/593,884, filed on Dec. 2, 2017.

(51) Int. Cl.
*G06F 11/00* (2006.01)
*G06F 11/26* (2006.01)
*G06F 30/15* (2020.01)
*G06F 30/20* (2020.01)
*G06F 30/30* (2020.01)
*G06F 30/3312* (2020.01)

(52) U.S. Cl.
CPC ............ *G06F 11/261* (2013.01); *G06F 30/15* (2020.01); *G06F 30/20* (2020.01); *G06F 30/30* (2020.01); *G06F 30/3312* (2020.01)

(58) Field of Classification Search
CPC ........ G06F 11/261; G06F 30/15; G06F 30/20; G06F 30/30; G06F 30/3312
See application file for complete search history.

(56) References Cited

U.S. PATENT DOCUMENTS

2017/0228562 A1* 8/2017 Guilley ................... H04L 9/002
2017/0344438 A1* 11/2017 Bilgiday ................. G06F 21/71

* cited by examiner

*Primary Examiner* — Joshua P Lottich (57) ABSTRACT

This application discloses a computing system implementing a functional safety validation tool to simulate an integrated circuit design with a stimulus vector. The computing system can inject a fault at a first node of the simulated integrated circuit design, which prompts alarm logic to trigger indicating a detection of the injected fault. The computing system, in response to the triggering of the alarm logic, can initiate back-propagation to identify which intermediate nodes of the simulated integrated circuit design, located between the first node and the alarm logic, have fault values that prompt the alarm logic to trigger. The computing system can generate a fault coverage presentation identifying a diagnostic coverage of the alarm logic for the stimulus vector based on when the alarm logic.

20 Claims, 6 Drawing Sheets

PARALLEL FAULT SIMULATOR WITH BACK PROPAGATION ENHANCEMENT

RELATED APPLICATION

This patent application claims priority to U.S. Provisional Patent Application No. 62/593,884, filed Dec. 2, 2017, which is incorporated by reference herein.

TECHNICAL FIELD

This application is generally related to electronic design automation and, more specifically, to parallel fault simulation and back propagation for analyzing failures rates in integrated circuit designs.

BACKGROUND

Designing and fabricating electronic systems typically involves many steps, known as a "design flow." The particular steps of a design flow often are dependent upon the type of electronic system to be manufactured, its complexity, the design team, and the fabricator or foundry that will manufacture the electronic system from a design. Typically, software and hardware "tools" verify the design at various stages of the design flow by running simulators and/or hardware emulators, or by utilizing formal techniques, allowing any errors in the design discovered during the verification process to be corrected.

Initially, a specification for a new electronic system can be transformed into a logical design, sometimes referred to as a register transfer level (RTL) description of the electronic system. With this logical design, the electronic system can be described in terms of both the exchange of signals between hardware registers and the logical operations that can be performed on those signals. The logical design typically employs a Hardware Design Language (HDL), such as System Verilog or Very high speed integrated circuit Hardware Design Language (VHDL).

The logic of the electronic system can be analyzed to confirm that it will accurately perform the functions desired for the electronic system, sometimes referred to as "functional verification." Design verification tools can perform functional verification operations, such as simulating, emulating, and/or formally verifying the logical design. For example, when a design verification tool simulates the logical design, the design verification tool can provide transactions or sets of test vectors, for example, generated by a simulated test bench, to the simulated logical design. The design verification tools can determine how the simulated logical design responded to the transactions or test vectors, and verify, from that response, that the logical design describes circuitry to accurately perform functions.

After functional verification, the logical design can be examined for potential failures in products or processes, sometimes referred to as "functional safety validation." Functional safety tools can perform Failure Mode and Effects Analysis (FMEA) to examine the logical design for potential failures and help select remedial actions that reduce cumulative impacts of life-cycle consequences or risks from a systems failure or fault. The FMEA can be used in conjunction with design and manufacturing processes, and has found many applications in the automotive, aerospace, biomedical and other safety critical or security related industries. While the use of FMEA in performing gate level timing simulations of the logical designs can identify critical faults in the logical design, as the number of gates increases in the logical design, so does the time-consumed for gate level timing simulations of the logical designs.

SUMMARY

This application discloses a computing system implementing a functional safety validation tool to simulate an integrated circuit design with a stimulus vector. In some embodiments, the computing system can test the integrated circuit design by determining the set of nodes and respective logical values that trigger alarm logic for the stimulus vector when a fault is injected at a first node in the set of nodes. The computing system can inject the fault at the first node of the simulated integrated circuit design, which prompts alarm logic to trigger indicating a detection of the injected fault. The computing system, in response to the triggering of the alarm logic, can initiate back-propagation to identify which intermediate nodes of the simulated integrated circuit design, located between the first node and the alarm logic, have fault values that prompt the alarm logic to trigger. The computing system can generate a fault coverage presentation identifying a diagnostic coverage of the alarm logic for the stimulus vector based on when the alarm logic. Embodiments will be described in greater detail below.

DETAILED DESCRIPTION

Illustrative Operating Environment

Figure 1:
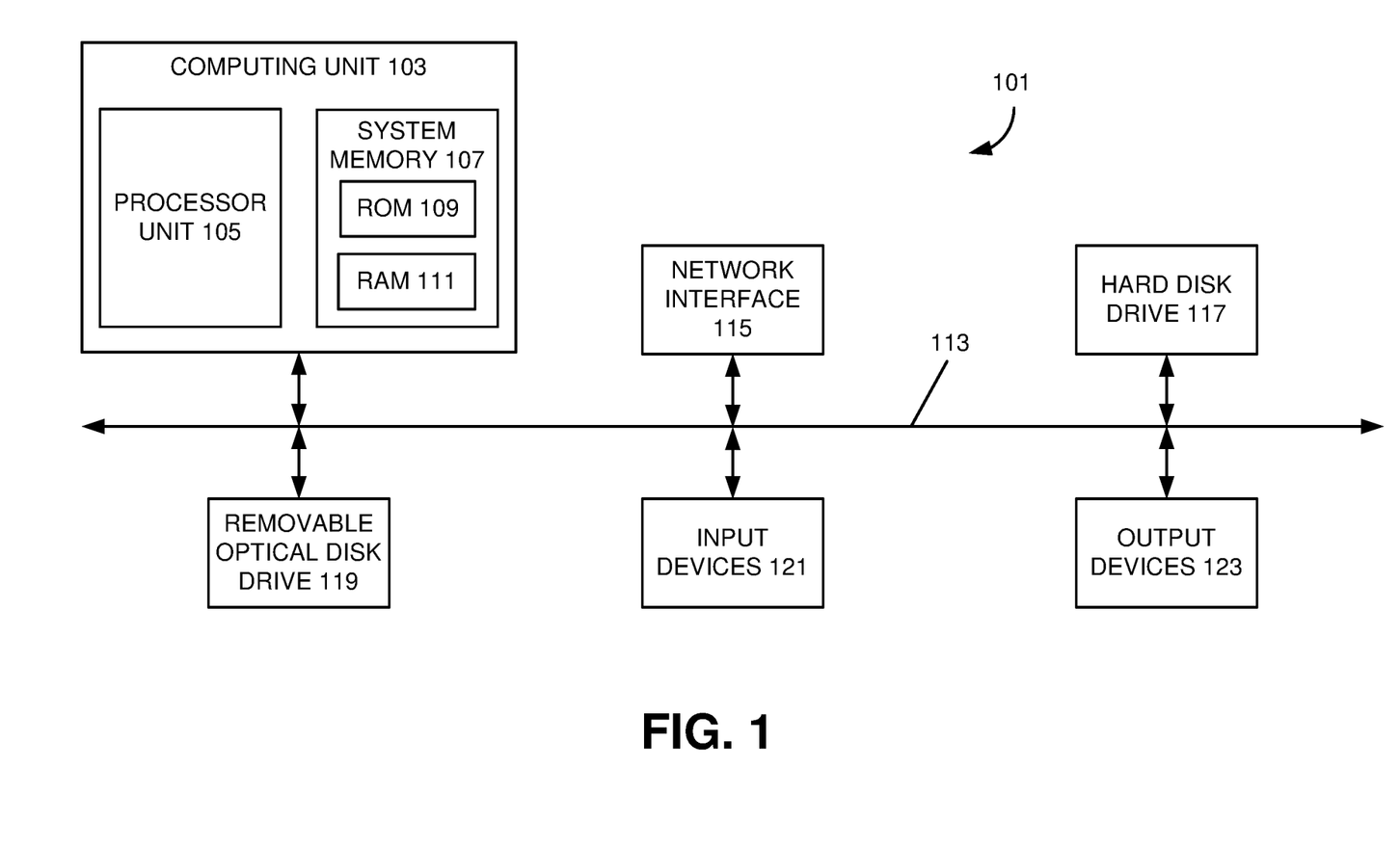
FIGS. 1 and 2 illustrate an example of a computer system of the type that may be used to implement various embodiments.

Various embodiments may be implemented through the execution of software instructions by a computing device 101, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices 117-123. For example, the processing unit 105 or the system memory 107 may be directly or indirectly connected to one or more additional memory storage devices, such as a hard disk drive 117, which can be magnetic and/or removable, a removable optical disk drive 119, and/or a flash memory card. The processing unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computing device 101, one or more of the peripheral devices 117-123 may be internally housed with the computing unit 103. Alternately, one or more of the peripheral devices 117-123 may be external to the housing for the computing unit 103 and connected to the bus 113 through, for example, a Universal Serial Bus (USB) connection.

With some implementations, the computing unit 103 may be directly or indirectly connected to a network interface 115 for communicating with other devices making up a network. The network interface 115 can translate data and control signals from the computing unit 103 into network messages according to one or more communication protocols, such as the transmission control protocol (TCP) and the Internet protocol (IP). Also, the network interface 115 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments may be implemented using a multi-processor computer, a plurality of single and/or multiprocessor computers arranged into a network, or some combination of both.

Figure 2:
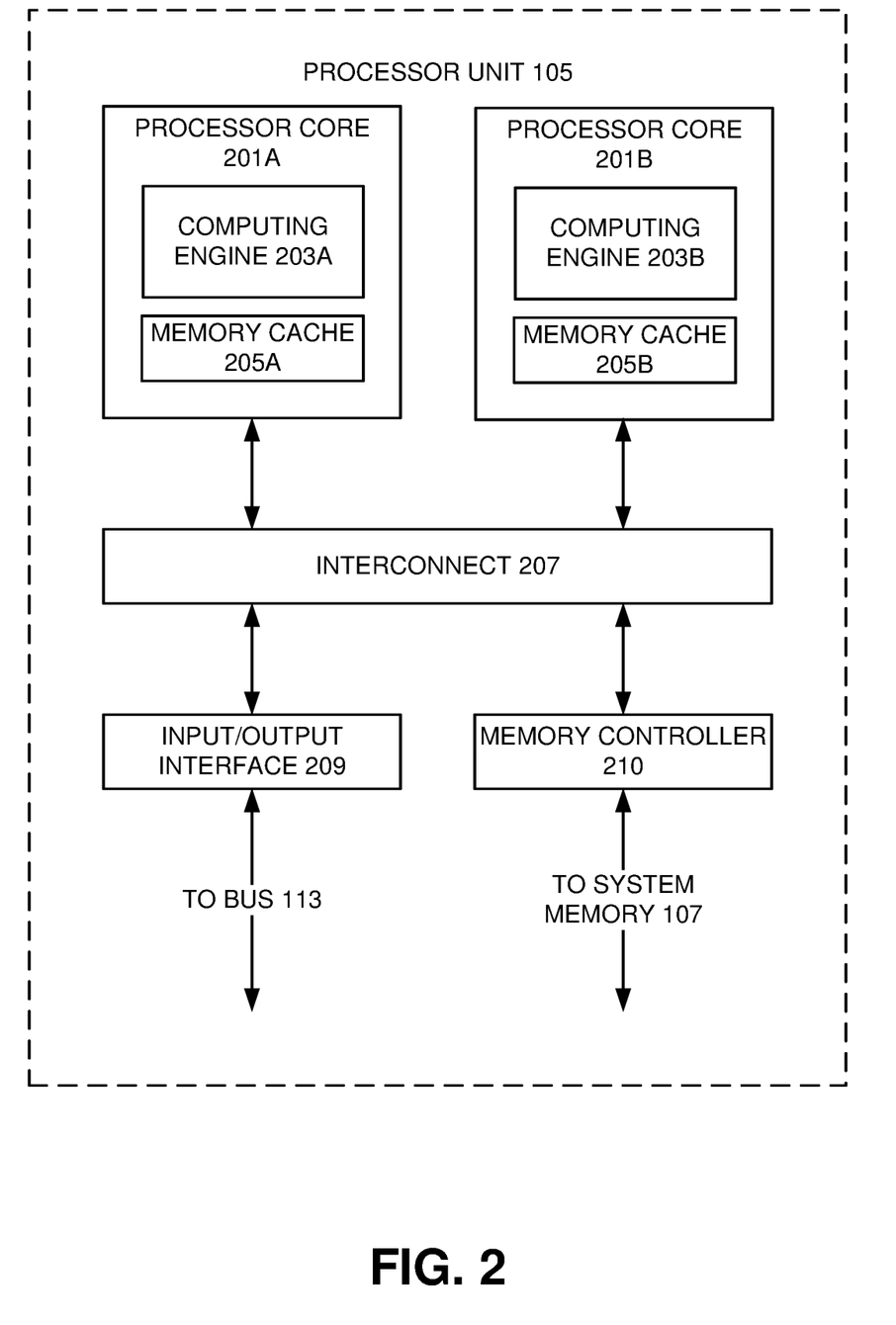

With some implementations, the processor unit 105 can have more than one processor core. Accordingly, FIG. 2 illustrates an example of a multi-core processor unit 105 that may be employed with various embodiments. As seen in this figure, the processor unit 105 includes a plurality of processor cores 201A and 201B. Each processor core 201A and 201B includes a computing engine 203A and 203B, respectively, and a memory cache 205A and 205B, respectively. As known to those of ordinary skill in the art, a computing engine 203A and 203B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203A and 203B may then use its corresponding memory cache 205A and 205B, respectively, to quickly store and retrieve data and/or instructions for execution.

Each processor core 201A and 201B is connected to an interconnect 207. The particular construction of the interconnect 207 may vary depending upon the architecture of the processor unit 105. With some processor cores 201A and 201B, such as the Cell microprocessor created by Sony Corporation, Toshiba Corporation and IBM Corporation, the interconnect 207 may be implemented as an interconnect bus. With other processor units 201A and 201B, however, such as the Opteron™ and Athlon™ dual-core processors available from Advanced Micro Devices of Sunnyvale, Calif., the interconnect 207 may be implemented as a system request interface device. In any case, the processor cores 201A and 201B communicate through the interconnect 207 with an input/output interface 209 and a memory controller 210. The input/output interface 209 provides a communication interface to the bus 113. Similarly, the memory controller 210 controls the exchange of information to the system memory 107. With some implementations, the processor unit 105 may include additional components, such as a high-level cache memory accessible shared by the processor cores 201A and 201B. It also should be appreciated that the description of the computer network illustrated in FIG. 1 and FIG. 2 is provided as an example only, and it not intended to suggest any limitation as to the scope of use or functionality of alternate embodiments.

Example Verification Environment

Figure 3:
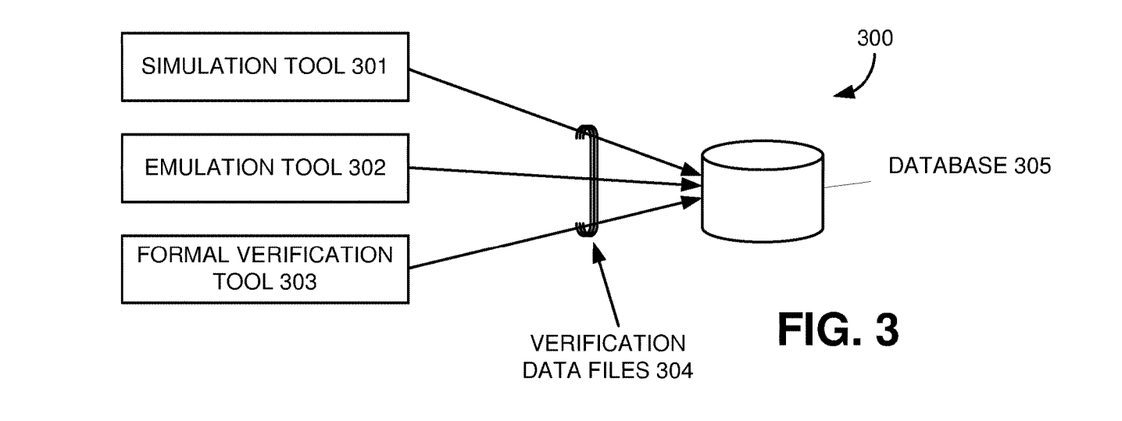
FIG. 3 illustrate an example verification system generated verification data from multiple verification tools that may be implemented according to various embodiments.

FIG. 3 illustrate an example verification system 300 storing coverage data from multiple verification tools that may be implemented according to various embodiments. Referring to FIG. 3, the verification data system 300 can include multiple verification tools, such as a simulation tool 301, an emulation tool 302, a formal verification tool 303, or the like, to functionally verify an electronic design described by a circuit design and generate verification data files 304 for storage in a database 305. In some embodiments, the verification data files 304 can include a Value Change Dump (VCD) file, for example, in an ASCII-based format. The circuit design can describe the electronic device both in terms of an exchange of data signals between components in the electronic device, such as hardware registers, flip-flops, combinational logic, or the like, and in terms of logical operations that can be performed on the data signals in the electronic device. The circuit design can model the electronic device at a register transfer level (RTL), for example, with code in a hardware description language (HDL), such as Very high speed integrated circuit Hardware Design Language (VHDL), System C, or the like. In some embodiments, the verification tools can receive the circuit design from a source external to the verification tools, such as a user interface of the computer network 101, another tool implemented by the computer network 101, or one or more of the verification tools may generate the circuit design internally.

The simulation tool 301 and the emulation tool 302 can respectively simulate or emulate a test bench and a design under verification, such as the circuit design, and generate the verification data files 304. The emulation tool 302 can perform functional verification with one or more hardware emulators configured to emulate the design under verification. The simulation tool 301 can implement the design verification tool with one or more processors configured to simulate the design under verification.

The test bench, during simulation or emulation, can generate test stimulus, for example, clock signals, activation signals, power signals, control signals, and data signals that, when grouped, may form test bench transactions capable of prompting operation of the design under verification. In some embodiments, the test bench can be written in an object-oriented programming language, for example, SystemVerilog or the like, which, when executed during elaboration, can dynamically generate test bench components for verification of the circuit design. A methodology library, for example, a Universal Verification Methodology (UVM)

library, an Open Verification Methodology (OVM) library, an Advanced Verification Methodology (AVM) library, a Verification Methodology Manual (VMM) library, or the like, can be utilized as a base for creating the test bench. The simulated or emulated design under verification, in response to the test stimuli, can generate output, which can be compared to expected output of the design under verification in response to the test stimuli by the simulation tool 301 or the emulation tool 302.

The formal verification tool 303 can analyze the circuit design in an attempt to functionally verify portions of the circuit design. In some embodiments, the formal verification tool 303 can utilize one or more formal techniques, such as a Binary Decision Diagram (BDD), a Boolean Satisfiability (SAT) Solver, an Automatic Test Pattern Generator (ATPG), Cut Point Prover, or the like, in an attempt to prove or disprove functionality of circuit design. The formal verification tool 303 also can utilize static design checking functionality, such as a clock domain crossing check, a reset domain check, a power domain check, or the like, which can be utilized in an attempt to functionally verify portions of the circuit design.

Functional Safety Validation

Figure 4:
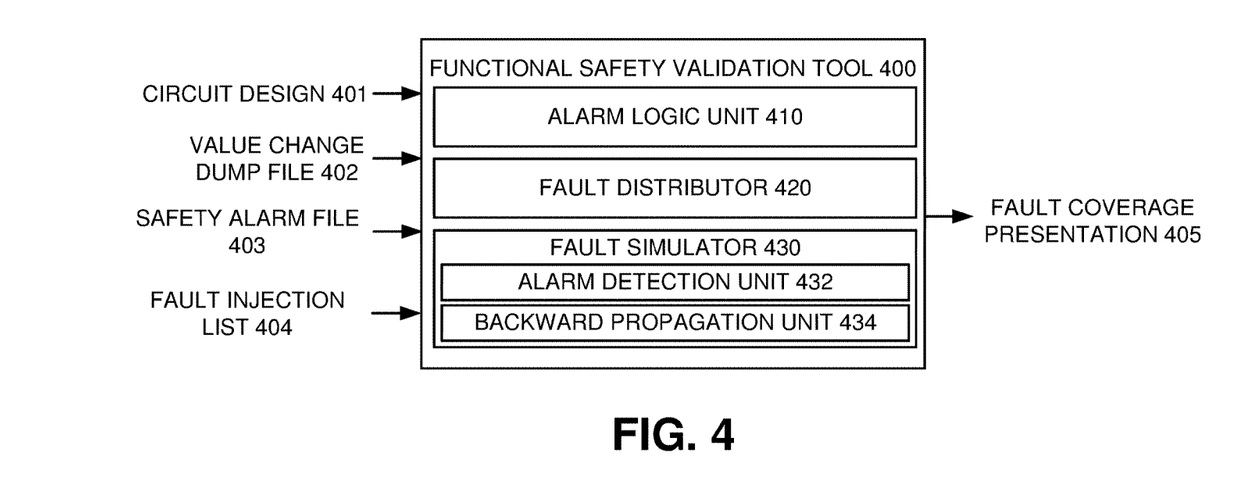
FIG. 4 illustrates an example functional safety validation tool with back-propagation analysis, which may be implemented according to various embodiments.
Figure 6:
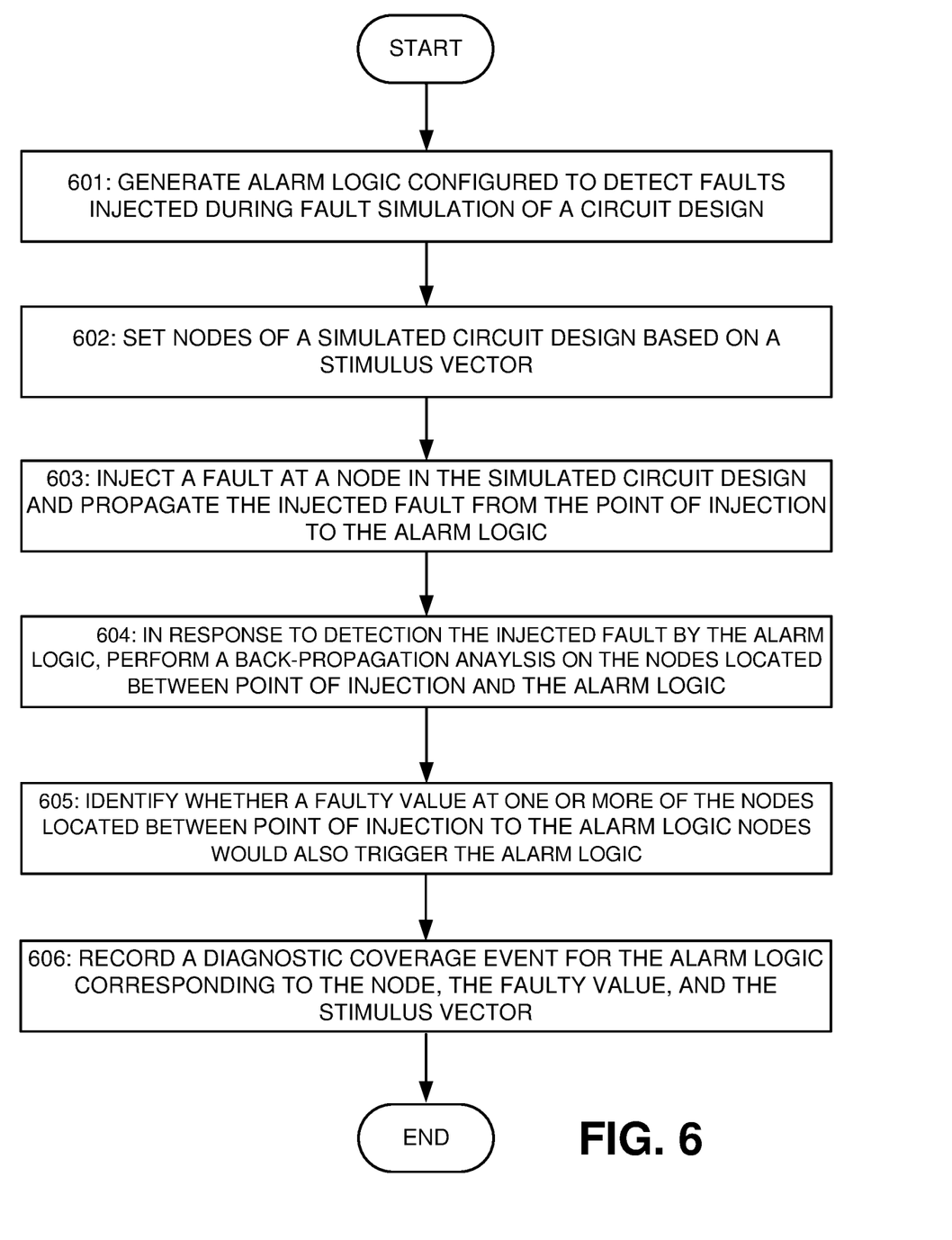
FIG. 6 illustrates an example flowchart implementing injected fault detection with back-propagation analysis, which may be implemented according to various embodiments.

FIG. 4 illustrates an example functional safety validation tool 400 with back-propagation analysis, which may be implemented according to various embodiments. FIG. 6 illustrates an example flowchart implementing injected fault detection with back-propagation analysis which may be implemented according to various embodiments. Referring to FIGS. 4 and 6, the functional safety validation tool 400 can receive a circuit design 401 that describes an electronic device both in terms of an exchange of data signals between components in the electronic device, such as hardware registers, flip-flops, combinational logic, or the like, and in terms of logical operations that can be performed on the data signals in the electronic device. The circuit design 401 can be gate-level netlist for the electronic device or model the electronic device at a register transfer level (RTL), for example, with code in a hardware description language (HDL), such as Very high speed integrated circuit Hardware Design Language (VHDL), System C, or the like. The functional safety validation tool 400 can receive a value change dump (VCD) file 402, for example, generated during functional verification of the circuit design 401 by design verification tools. In some embodiments, the value change dump (VCD) file 402 can describe time-ordered value changes for signals that occurred during functional verification of the circuit design 401, which can be specified in an ASCII-based format.

The functional safety validation tool 400 can receive a safety alarm file 403 to describe functionality capable of detecting faults occurring during a fault injection campaign. The functional safety validation tool 400 can receive a fault injection list 404 that includes possible faults to inject into the circuit design during a fault injection campaign and portions of the circuit design 401 to inject the possible faults.

The functional safety validation tool 400 can utilize the circuit design 401, the value change dump (VCD) file 402, the safety alarm file 403, and the fault injection list 404 to inject faults during a gate-level simulation of the circuit design 401 and generate a fault coverage report 405 based, at least in part, on whether the functional safety validation tool 400 detected the injected faults.

The functional safety validation tool 400 can include an alarm logic unit 410, which in a block 601 of FIG. 6, can generate alarm logic configured to detect faults injected during fault simulation of the circuit design 401. In some embodiments, the alarm logic, when implemented in a simulation environment with the circuit design 401, can compare values propagated during a fault injection campaign against expected values to detect a presence of the injected faults. The alarm logic can be triggered during fault simulation due to a detection of an injected fault and can inform the functional safety validation 400 of the presence of an injected fault in response to being triggered.

The functional safety validation tool 400 can include a fault distributor 420 and a fault simulator 430 can perform a gate-level simulation of at least a portion of the circuit design 401. The fault distributor 420 can insert the alarm logic generated by the alarm logic unit 410 into the gate-level simulation with the circuit design 401. The fault distributor 420 can identify a stimulus vector for the simulated circuit design 401 and direct the fault simulator 430 to, corresponding to a block 602 of FIG. 6, set nodes of the simulated circuit design 401 to values associated with the stimulus vector. The fault simulator 430 can propagate the values set according to the stimulus vector through logic cones of the simulated circuit design 401, for example, gate-level combinational logic and registers, to the alarm logic inserted into the gate-level simulation. In a block 603 of FIG. 6, the fault simulator 430, for example, based on direction from the fault distributor 420, can inject one or more of the faults from the fault injection list 404 into the simulated circuit design 401 and propagate the injected faults from the point of injection through the logic cones to the alarm logic inserted into the gate-level simulation.

The fault simulator 430 can include an alarm detection unit 432 to determine when the alarm logic was triggered by the propagation of the injected faults during the gate-level simulation of the circuit design 401. The alarm detection unit 432 can record a diagnostic coverage event when the alarm logic was triggered. The diagnostic coverage event can identify the node injected with the fault, the fault value, and the stimulus vector utilized during the simulation of the circuit design 401 when the alarm logic was triggered. When the alarm logic was triggered by the propagation of the injected faults during the gate-level simulation of the circuit design 401, alarm detection unit 432 can determine that the injected fault was masked by other circuitry in the logic cones of the simulated circuit design 401 and record the event as a safe fault. The functional safety validation tool 400 can include the diagnostic coverage events in the fault coverage presentation 405.

The fault simulator 430 can include a back-propagation unit 434 to identify other nodes in the logic cones of the simulated circuit design 401 that include faults cause by the propagation of the injected fault and also would trigger the alarm logic. In a block 604 of FIG. 6, the fault simulator 430 can initiate an analysis of the simulated circuit design 401 by the back-propagation unit 434 in response to the detection of the alarm logic being triggered. In some embodiments, the back-propagation unit 434 can perform the analysis by traversing nodes from the alarm logic towards to location of the fault injection to, at a block 605, identify whether a faulty value at those nodes would trigger the alarm logic.

In a block 606 of FIG. 6, the back-propagation unit 434 can record a diagnostic coverage event for the alarm logic corresponding to the node, the faulty value, and the stimulus vector. The functional safety validation tool 400 can include the diagnostic coverage events in the fault coverage presentation 405. By performing back-propagation analysis, the fault simulator 430 can determine multiple diagnostic coverage events in a single simulation run with the stimulus vector, which can reduce a total number of simulation runs for the circuit design 401, improving simulation throughput.

In some embodiments, the fault simulator 430 can perform concurrent fault propagation in a single simulation run, for example, analyzing multiple faults and performing multiple back-propagation analysis in parallel. In other words, for every fault in the concurrent fault propagation of the single simulation run, which triggers alarm logic, the fault simulator 430 can separately and concurrently perform back-propagation analysis to detect additional nodes and logical states that were not covered by the original fault propagation path. Embodiments of back-propagation analysis based on alarm logic triggering will be described below in greater detail.

Figure 5A:
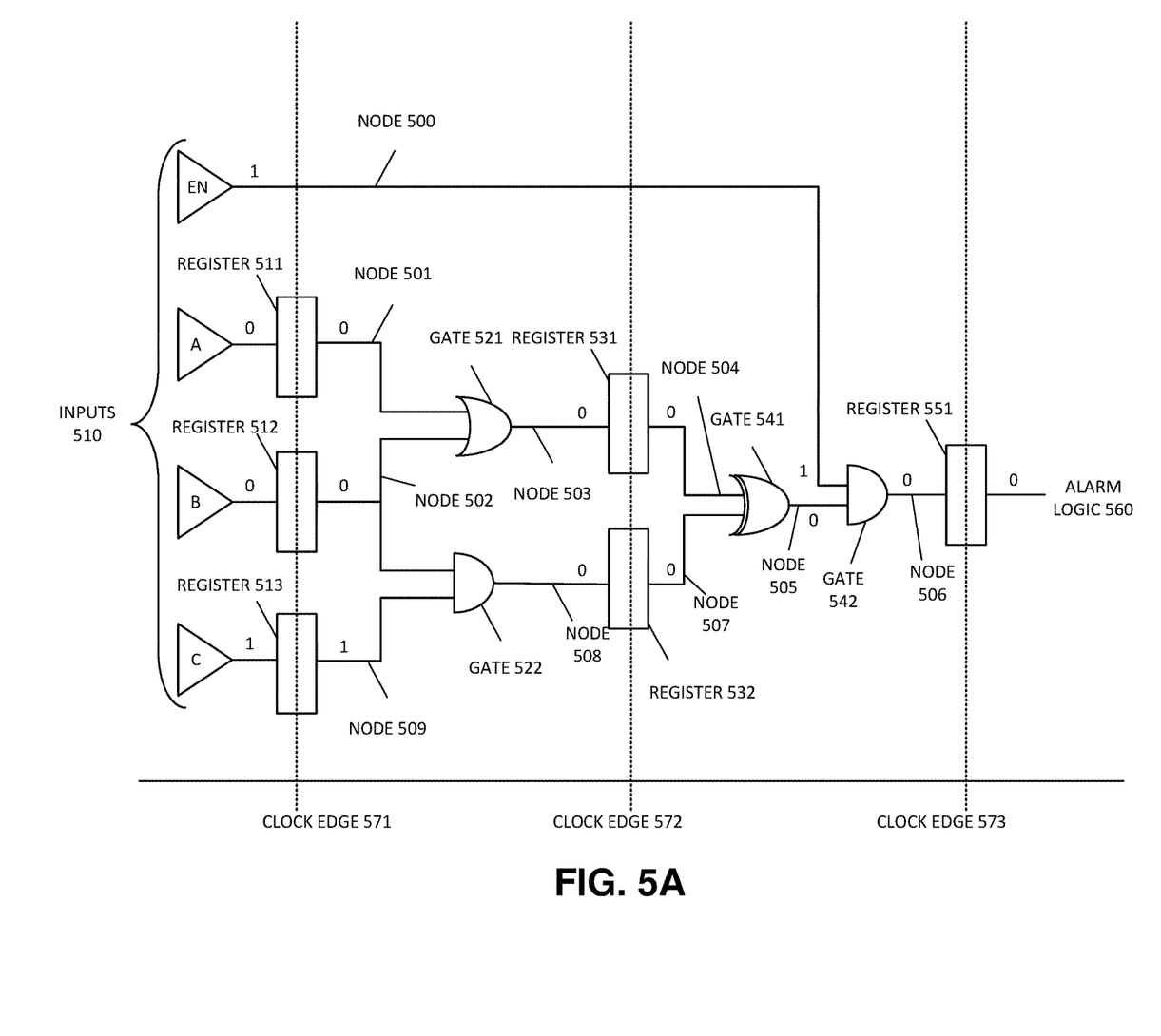
FIGS. 5A and 5B illustrate example injected fault detection with back-propagation analysis, which may be implemented according to various embodiments.
Figure 5B:
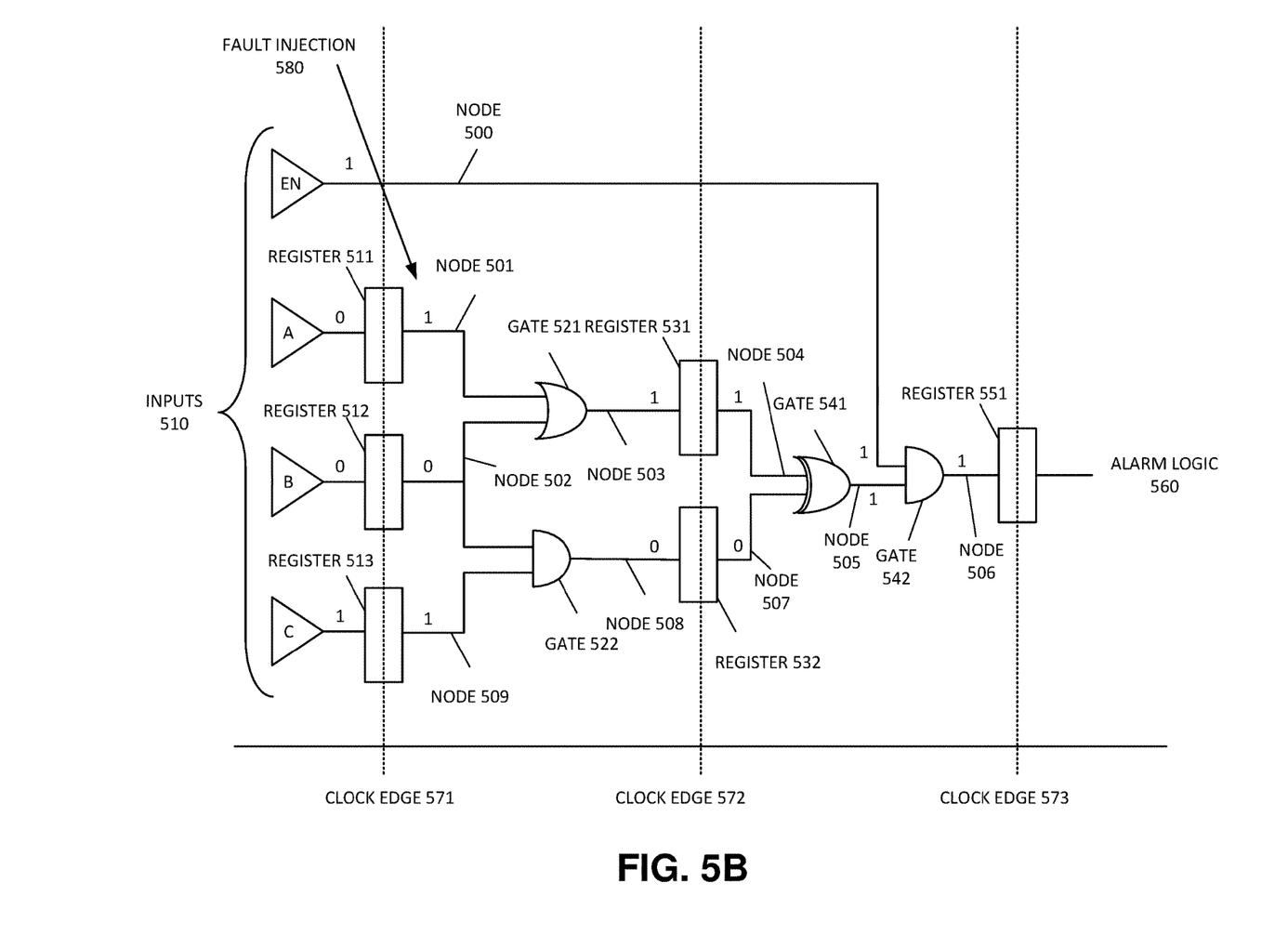

FIGS. 5A and 5B illustrate example injected fault detection with back-propagation analysis, which may be implemented according to various embodiments. Referring to FIG. 5A, an electronic device described by a circuit design can include inputs 510 configured to receive a stimulus vector during simulation of the circuit design, which can propagate through multiple nodes 501-509 to alarm logic 560. The electronic device includes multiple stages defined by registers 511-513, 531, 532, and 551, such as flip-flops or the like, which can be triggered be clock edges 571-573. The electronic device also includes logic gates 521, 522, 541, and 542 disposed between the registers 511-513, 531, 532, and 551. The combination of the 511-513, 531, 532, and 551 and the logic gates 521, 522, 541, and 542 can allow values in the stimulus vector received at the inputs 510 during simulation to be propagated to the alarm logic 560.

In the instant example, the stimulus vector received at the inputs 510 can correspond to {A, B, C, EN}={0, 0, 1, 1}. During gate-level simulation, in response to the clock edge 571, the value "0" of the stimulus vector received at input A can be propagated through the register 511 to node 501, the value "0" of the stimulus vector received at input B can be propagated through the register 512 to node 502, and the value "1" of the stimulus vector received at input A can be propagated through the register 513 to node 509. The values at nodes 501 and 502 also can propagate through OR gate 521 to node 503 and register 531. The values at nodes 502 and 509 also can propagate through AND gate 522 to node 508 and register 532.

In response to the clock edge 572, the value at node 503 can be propagated through the register 531 to node 504, and the value at node 508 can be propagated through the register 532 to node 507. The values at nodes 504 and 507 also can propagate through XOR gate 541 to node 505, and the values nodes 505 and 500 can propagate through AND gate 542 to node 506 and register 551. In response to the clock edge 573, the value at node 506 can be propagated through the register 551 to the alarm logic 560.

Referring to FIG. 5B, the electronic device can be similar to the electronic device described into FIG. 5A except the value of "0" at node 501 undergo a fault injection 580, which can change the value of "0" to a value "1". The fault simulator can propagate the value of the fault through the electronic device to the alarm logic 560, for example, changing the value at nodes 503-506. In response to the clock edge 573 after the fault injection 580, the alarm logic 560 can detect the injected fault at node 501, for example, due to the value change propagated through register 551. From a functional safety perspective, the triggering of the alarm logic 560 indicates that the injected fault of a value "1" at node 501 can be covered or detected by the alarm logic 560 and thus functional safety credit in the form of diagnostic coverage may be assigned to node 501 for the stimulus vector.

Based on the detection of the fault injection 580 by the alarm logic 560, the fault simulator also can implement a back-propagation analysis from the alarm logic 560 towards the node 501 to determine which of the nodes 502-509 have faulted values or values that would prompt the alarm logic 560 to trigger. In some embodiments, the fault simulator can perform the back-propagation analysis clock cycle-by-clock cycle, for example, analyzing nodes 504-507 located between registers 531, 532, and 551 triggered by the clock edge 572. In this example, the back-propagation analysis by the fault simulator can identify that any fault in the nodes 504-507 would have also triggered the alarm logic 506 for the stimulus vector received at the inputs 510.

Since the node 506 connects to the alarm logic 506 via the register 551, any fault in the node 5066 would have also triggered the alarm logic 560. The fault simulator can assign diagnostic coverage credit for node 506 as having a fault value of "1". When the node 505 has a faulty value of "1," the alarm logic 560 would trigger in conjunction with the stimulus vector at input EN having a value of "1". The fault simulator can assign diagnostic coverage credit for node 505 as having a fault value of "1".

When either of the nodes 504 or 507 has a faulty value of "1," the XOR gate 541 would output a faulty value of "1" to the node 505, which would trigger the alarm logic. Although the node 507 was not a part of the original fault propagation path from the node 501 to the alarm logic 560, the back-propagation analysis can identify a faulty value of "1" on the node 507 propagates a fault to the alarm logic 560 for the stimulus vector. The fault simulator can assign diagnostic coverage credit for the nodes 504 and 507 as having a fault value of "1".

The fault simulator can then perform the back-propagation analysis for the next clock cycle, for example, analyzing nodes 502, 503, 508, and 509 located between registers 511-513, 531, and 532 triggered by the clock edge 571. In this example, the back-propagation analysis by the fault simulator can identify that any fault value of "1" at the nodes 502, 503, and 508 would have propagated to triggered the alarm logic 506, but found that a fault value at the node 509 would not trigger the alarm logic 560. The fault simulator determined 8 of the nodes 501-508 could be individually injected with a fault that would be detected by alarm logic 506 using a single simulation run rather than a separate simulation run for each injected fault.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments, those skilled in the art will appreciate that there are numerous variations and permutations of the above described systems and techniques that fall within the spirit and scope of the invention as set forth in the appended claims. For example, while some of the specific terminology has been employed above to refer to electronic design automation processes, it should be appreciated that various examples may be implemented using any electronic system.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
    injecting, by a computing system, a fault at a first node of a simulated integrated circuit design having been input with a stimulus vector, wherein alarm logic is configured to trigger indicating a detection of the injected fault;
    identifying, by the computing system, which intermediate nodes of the simulated integrated circuit, located between the first node and the alarm logic, have fault values that prompt the alarm logic to trigger; and
    generating, by the computing system, a fault coverage presentation identifying a diagnostic coverage of the alarm logic for the stimulus vector based on when the alarm logic was triggered.

2. The method of claim 1, further comprising propagating, by the computing system, the fault values associated with the injected fault through the intermediate nodes, wherein the propagated fault values trigger the alarm logic indicating the detection of the injected fault.

3. The method of claim 2, wherein the identifying of which of the intermediate nodes have fault values that prompt the alarm logic to trigger is performed in response to the detection of the injected fault.

4. The method of claim 2, further comprising recording a diagnostic coverage event based on the detection of the injected fault at the first node of the simulated integrated circuit design, wherein the fault coverage presentation includes the recorded diagnostic coverage event.

5. The method of claim 1, wherein the identifying of which of the intermediate nodes have fault values that prompt the alarm logic to trigger further comprises performing back-propagation analysis by traversing the intermediate nodes from the alarm logic towards the first node.

6. The method of claim 5, wherein the back-propagation analysis is performed on a clock cycle-by-clock cycle basis.

7. The method of claim 1, further comprising recording a diagnostic coverage event for each of the intermediate nodes identified to have the fault values that prompt the alarm logic to trigger, wherein the fault coverage presentation includes the recorded diagnostic coverage event.

8. An apparatus comprising at least one non-transitory computer-readable memory device storing instructions configured to cause one or more processing devices to perform operations comprising:
    injecting a fault at a first node of a simulated integrated circuit design having been input with a stimulus vector, wherein alarm logic is configured to trigger indicating a detection of the injected fault;
    identifying which intermediate nodes of the simulated integrated circuit, located between the first node and the alarm logic, have fault values that prompt the alarm logic to trigger; and
    generating a fault coverage presentation identifying a diagnostic coverage of the alarm logic for the stimulus vector based on when the alarm logic was triggered.

9. The apparatus of claim 8, wherein the instructions are configured to cause one or more processing devices to perform operations further comprising propagating the fault values associated with the injected fault through the intermediate nodes, wherein the propagated fault values trigger the alarm logic indicating the detection of the injected fault.

10. The apparatus of claim 9, wherein the identifying of which of the intermediate nodes have fault values that prompt the alarm logic to trigger is performed in response to the detection of the injected fault.

11. The apparatus of claim 9, wherein the instructions are configured to cause one or more processing devices to perform operations further comprising recording a diagnostic coverage event based on the detection of the injected fault at the first node of the simulated integrated circuit design, wherein the fault coverage presentation includes the recorded diagnostic coverage event.

12. The apparatus of claim 8, wherein the identifying of which of the intermediate nodes have the fault values that prompt the alarm logic to trigger further comprises performing back-propagation analysis by traversing the intermediate nodes from the alarm logic towards the first node.

13. The apparatus of claim 12, wherein the back-propagation analysis is performed on a clock cycle-by-clock cycle basis.

14. The apparatus of claim 8, wherein the instructions are configured to cause one or more processing devices to perform operations further comprising recording a diagnostic coverage event for each of the intermediate nodes identified to have fault values that prompt the alarm logic to trigger, wherein the fault coverage presentation includes the recorded diagnostic coverage event.

15. A system comprising:
a memory system configured to store computer-executable instructions; and
a computing system, in response to execution of the computer-executable instructions, is configured to:
inject a fault at a first node of a simulated integrated circuit design having been input with a stimulus vector, wherein alarm logic is configured to trigger indicating a detection of the injected fault,
identify which intermediate nodes of the simulated integrated circuit, located between the first node and the alarm logic, have fault values that prompt the alarm logic to trigger, and
generate a fault coverage presentation identifying a diagnostic coverage of the alarm logic for the stimulus vector based on when the alarm logic was triggered.

16. The system of claim 15, wherein the computing system, in response to execution of the computer-executable instructions, is further configured to propagate the fault values associated with the injected fault through the intermediate nodes, wherein the propagated fault values trigger the alarm logic indicating the detection of the injected fault.

17. The system of claim 16, wherein the computing system, in response to execution of the computer-executable instructions, is further configured to identify which of the intermediate nodes have fault values that prompt the alarm logic to trigger in response to the detection of the injected fault.

18. The system of claim 16, wherein the computing system, in response to execution of the computer-executable instructions, is further configured to record a diagnostic coverage event based on the detection of the injected fault at the first node of the simulated integrated circuit design, wherein the fault coverage presentation includes the recorded diagnostic coverage event.

19. The system of claim 15, wherein the computing system, in response to execution of the computer-executable instructions, is further configured to identify of which of the intermediate nodes have fault values that prompt the alarm logic to trigger by performing back-propagation analysis which traverses the intermediate nodes from the alarm logic towards the first node.

20. The system of claim 15, wherein the computing system, in response to execution of the computer-executable instructions, is further configured to record a diagnostic coverage event for each of the intermediate nodes identified to have the fault values that prompt the alarm logic to trigger, wherein the fault coverage presentation includes the recorded diagnostic coverage event.

* * * * *